United States Patent [19]
Krithivas et al.

[11] Patent Number: 6,067,628
[45] Date of Patent: May 23, 2000

[54] METHOD TO MONITOR UNIVERSAL SERIAL BUS HUB OVERCURRENT

[75] Inventors: Ramamurthy Krithivas; Sharma Upadhyayula, both of Chandler, Ariz.; Steve McGowan, Portland, Oreg.

[73] Assignee: Intel Corporation, Santa Clara, Calif.

[21] Appl. No.: 09/057,954

[22] Filed: Apr. 9, 1998

[51] Int. Cl.[7] ...................................................... G06F 1/30
[52] U.S. Cl. ............................................. 713/340; 710/63
[58] Field of Search .................................. 713/340, 300; 710/62, 63, 2, 8, 46, 101, 129, 126; 327/108; 345/168, 212; 364/189; 709/301; 714/1, 14; 370/257, 912

[56] References Cited

U.S. PATENT DOCUMENTS 5,675,813 10/1997 Holmdahl .................................. 713/310
5,799,196 8/1998 Flannery .................................. 713/320
5,903,777 5/1999 Brief ........................................ 375/211

*Primary Examiner*—Gopal C. Ray
*Attorney, Agent, or Firm*—Blakely, Sokoloff, Taylor & Zafman LLP

[57] ABSTRACT

A method for recognizing an overcurrent event in a universal serial bus is described. The method comprises the step of monitoring communication between a first layer and a second layer of the software layers of the universal serial bus. The method further comprises the step of generating a data structure configured to store the communication between the first layer and the second layer. The method also comprises the step of parsing the data structure to locate a data transition indicating the overcurrent event.

17 Claims, 4 Drawing Sheets

METHOD TO MONITOR UNIVERSAL SERIAL BUS HUB OVERCURRENT

FIELD OF THE INVENTION

The present invention relates to monitoring data flow to detect an overcurrent condition in a network. More particularly, the present invention relates to inserting a filter driver between the operating system layers of a Universal Serial Bus ("USB") system to detect overcurrent events in a USB hub device.

BACKGROUND

Improvements in personal computer designs has led to new designs that support multiple peripheral devices. The peripheral devices range from digital joysticks, scanners, digital speakers, digital cameras, to personal computer telephones. In conjunction with the advent of improved personal computer designs, microprocessors with high operating frequencies and large memory storage are also being developed. Accordingly, the combination of new personal computer designs and high speed microprocessors has resulted in computer systems concurrently running multiple applications while supporting multiple peripheral devices.

Prior art computer system supported peripheral devices by mapping descriptions of the peripheral devices to the microprocessor's input/output ("I/O") address space. The mapping process, however, creates numerous disadvantages. In particular, the mapping process combined with the operation of multiple applications exhausts the computer system's resource space. Furthermore, the mapping process typically results in I/O conflicts within the computer system. Additionally, in prior art computer systems the addition of new devices requires installation of expansions cards to support the communication between the computer system and the newly added device.

To counteract the disadvantages of the I/O mapping process, a Universal Serial Bus ("USB") system was developed in the prior art. USB systems provide a robust interface that allows multiple peripheral devices to couple to a computer system without reconfiguration concerns. USB systems also provide automatic detection and configuration of peripheral devices without exhausting the computer system's resources.

Typically, USB systems operate by creating a bounded transmission media between the computer system and the multiple peripheral devices connected to the computer system. The bounded transmission media has a guaranteed bandwidth and bounded delays between packet transmission. To maintain the bounded transmission media and the robust interface, the USB system consists of a multi-component software layer that interacts directly with the USB hardware.

FIG. 1 illustrates one embodiment of a prior art computer system. In particular, computer system 100 shows primary system 102 coupled to peripheral devices 110 through 170. Primary system 102 comprises monitor 110 coupled to central processing unit 105. Typically, computer system 100 executes software instructions provided to system 100 using a microprocessor (not shown) included in central processing unit 105. The executed software instruction are displayed on monitor 110. Central processing unit 105 also includes a USB interface, USB root hub 115. USB root hub 115 includes two ports and provides a communication media between primary system 102 and peripheral devices 110 through 170. Accordingly, transactions generated by central processing system 105 are forwarded to USB root hub 115 and transmitted to a particular peripheral device. Using USB root hub 115, computer system 100 manages peripheral devices 110 through 170 without exhausting system resource. In particular, by forwarding data and instructions via USB root hub 115, computer system controls power to USB ports, enables/disables ports, recognizes devices coupled to each port, and reports status events associated with each port to central processing unit 105.

For one embodiment, peripheral devices 110 through 170 are coupled via a hub dual port interface. For alternative embodiments, hubs couple to peripheral devices via multiport interfaces. As illustrated in FIG. 1, the USB root hub 115 includes two ports, port 115a and 115b. Port 115b is coupled to keyboard 120 and port 115a is coupled to monitor 110. In particular, as illustrated in FIG. 1, hub 116 is included in monitor 110. Hub 116 provides two connection ports, port 116a and port 116b. Port 116a couples monitor 110 to port 115a and port 116b is coupled to hub 130. Hub 130 provides two connection ports, port 130a and port 130b. Port 130a is coupled to joy stick 140 and port 130b is coupled to hub 150. Hub 150 is coupled to digital speakers 160 and digital scanner 170 via ports 150a and 150b, respectively. Similar to USB root hub 115, hub 116, hub 130, and hub 150 provide additional connection ports. In particular, hubs 116, 130 and 150 are used to forward data towards primary interface 102, upstream direction, or to forward data toward a peripheral device, downstream direction. For one embodiment, the transmitted data includes the device descriptors of devices coupled to the downstream ports of the hub. Hubs 116, 130, and 150 also transmit a status report upstream when polled by central processing unit 105. The status report includes information regarding the attachment/detachment of a device, the number of downstream ports, and the power model of the hub. The physical communication between primary interface 102 and peripheral devices 110 through 170 is maintained by USB hub root 115. The sequencing and evaluation of the communicated data, however, is maintained by USB software layers.

FIG. 2 illustrate one embodiment of a prior art USB software layers. The first layer, application 205 comprises software loaded into primary interface 102. Typically, the loaded software requires interacts with a peripheral device. For example, for one embodiment, the loaded software requires input from a user via peripheral device keyboard 120. Because multiple peripheral devices are available to communicate with a given application, USB software layers 215 through 220 and USB hardware controller 225 are used to provide a communication protocol between application 205 and the multiple peripheral device.

The second layer of the prior art USB software layers is operating system ("OS") 210. OS 210 includes device drivers (not shown) for each class of device coupled to computer system 100. A class corresponds to a group of peripheral devices that have similar attributes and services. For example, a given class of device comprises any compact disc ("CD") device coupled to computer system 100. Accordingly, a CD device driver object code describing the CD device's functional interface exists in OS 210. Similarly, another class of device comprises any hub device coupled to computer system 100. Thus, to supports hubs a hub driver object code describing the hub's functional interface exists in OS 210. Typically, the device drivers are loaded into central processing unit 105 during a reset. Subsequent to the reset of central processing unit 105, OS 210 detects and enumerates the actual peripheral devices coupled to USB root hub 115. Using a list of enumerated devices, OS 210 manages and maintains the communication between application 205 and peripheral devices coupled to computer system 100. Application 205, however, is unaware of the USB serial transfer mechanisms involved in the USB interface of computer system 100.

USB driver ("USBD") 215 provides the software interface for the USB serial transfer mechanisms. USBD 215 maintains the characteristics of each USB device 230-N recognized by OS 210. Accordingly, when data is transferred downstream/upstream USBD 215 organizes the data transfer into individual transactions that satisfy the guaranteed bandwidth of the USB.

Subsequent to the organization of data transfer by USBD 215, host controller driver ("HCD") 220 schedules the data transfer over the USB interface. The scheduling of data transfers is performed via transaction lists generated by HCD 220. Each list consists of pending transaction targeted to one or more of the USB devices 230-N. In particular, a transaction list typically includes the USB device address, type of transfer, direction of transfer, and the address of the device driver's memory buffer where data is stored.

Using the scheduling information the last layer of USB software layers, USB host controller 225, executes the scheduled transactions. Two types of transaction are processed by USB host controller 225, write and read transactions. In a write transaction, USB host controller 225 reads data from the memory buffer, performs a parallel to serial conversion, generates a transmission packet, and transmits the packet over the USB interface via USB root hub 115. During a read transaction, USB host controller 225 generates a read transaction packet and transmits the read transaction packet over the USB interface via USB root hub 115. Subsequent to the transmission of the read transaction packet, the target device recognizes that data is requested and transmits a response to USB root hub 115. The USB root hub 115 forwards the transmitted data to USB host controller 225. USB host controller 225, in turn, performs a serial to parallel conversion and returns the data to the device driver's memory buffer.

As previously described, the multiple software layers in conjunction with the USB hardware configuration allow the USB system to detect/support multiple peripheral devices coupled to computer system 100. Furthermore, the addition of hubs to the USB system provides a tiered topology where hubs provide ports for the addition of peripheral devices. The tiered topology, however, requires that a given hub is responsible for the maintenance/status of the peripheral devices coupled to the downstream ports of the hub. For example, provided a new hub is coupled to computer system 100. The new hub is responsible for generating a status report whenever polled by central processing unit 105. Typically, the status report indicates the attachment/detachment of device, the number of downstream ports, and the power model of the hub.

One disadvantage of the tiered topology results from an overcurrent event. An overcurrent event describes a device consuming power that exceeds the threshold power available from a downstream port of a hub. In particular, provided a downstream rogue device coupled to a hub causes an overcurrent event, during the status report the hub relays the overcurrent event to USBD 215 via an overcurrent bit indicator. A USB hub driver via USBD 215, in turn, automatically shuts down the port supplying connection to the rogue device via HCD 220 and USB host controller 225. The automatic shutdown of the port, however, is not apparent to the end user of computer system 100. Furthermore, the downstream port of the affected hub remains inoperable until the hub is reset. Accordingly, removing the rogue device does not restore operation to the downstream port. Thus, the end user incorrectly believes that the primary interface 102, monitor 110, or USB root hub 115 is operating incorrectly.

SUMMARY OF THE INVENTION

A method for recognizing an overcurrent event in a universal serial bus is disclosed. The method comprises the step of monitoring communication between a first layer and a second layer of the software layers of the universal serial bus. The method further comprises the step of generating a data structure configured to store the communication between the first layer and the second layer. The method also comprises the step of parsing the data structure to locate a data transition indicating the overcurrent event.

Other features and advantages of the present invention will be apparent from the accompanying drawings and from the detailed description that follows.

BRIEF DESCRIPTION OF THE DRAWINGS

The features and advantages of the present invention are illustrated by way of example and not limitation in the figures of the accompanying drawings in which like references indicate similar elements and in which.

DETAILED DESCRIPTION

A method to monitor universal serial bus ("USB") hub overcurrent is disclosed. The monitoring is performed transparent to the USB system. For one embodiment, a filter driver is inserted between the software layers of a USB system. In particular, the filter driver is inserted between the USB driver and the USB hub driver included in the operating system. The filter driver identifies the hub overcurrent event and reports the overcurrent event to the end user via a user interface. For an alternative embodiment, the filter driver identifies the rogue peripheral device causing the overcurrent event and reports the rogue peripheral device to the end user via the user interface.

An intended advantage of an embodiment of the present invention is to notify the end user of a computer system of an overcurrent event. In particular, notifying the end user of an overcurrent event allows the user to isolate a specific problem in the computer system without overhauling the entire computer system.

Another intended advantage of an embodiment of the preset invention is to notify the end user of a computer system of a rogue device causing an overcurrent event. In particular, notifying the end user of the rogue device causing the overcurrent event allows the user to isolate a specific problem in the computer system without overhauling the entire computer system.

Yet another intended advantage of an embodiment of the preset invention is to notify an application of a rogue device causing an overcurrent event.

Figure 1:
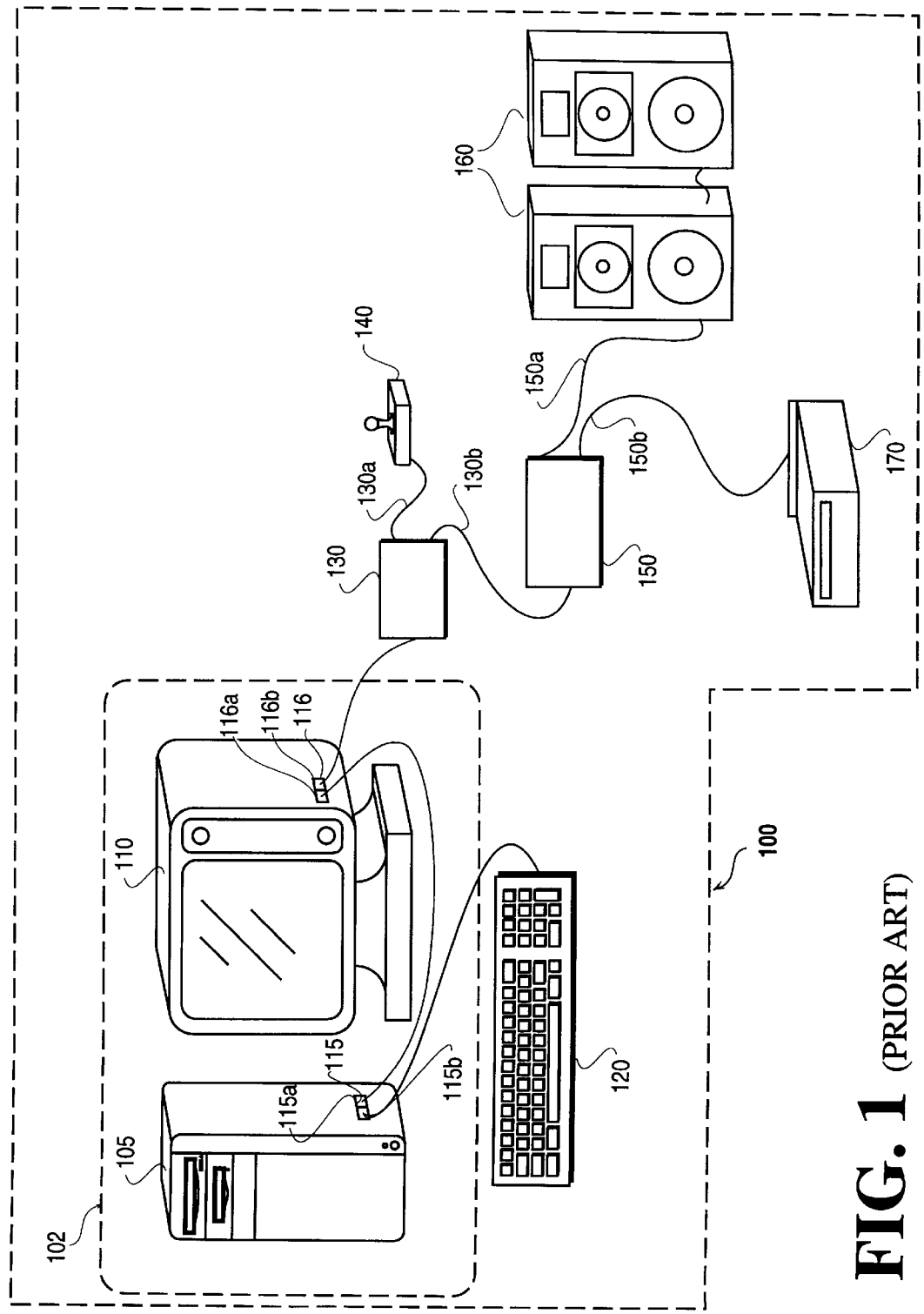
FIG. 1 shows a prior art computer system.
Figure 2:
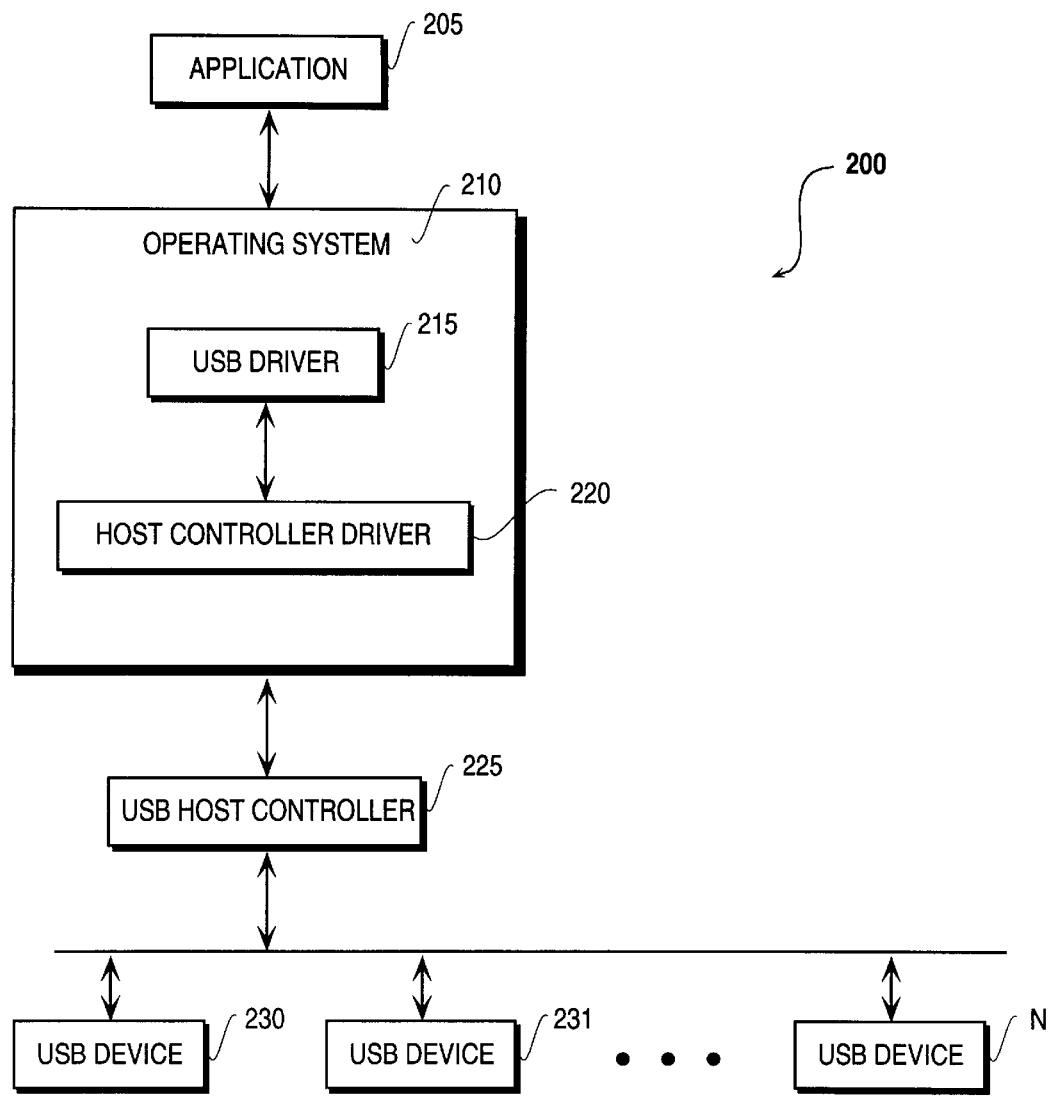
FIG. 2 show a prior art USB software layers.
Figure 3:
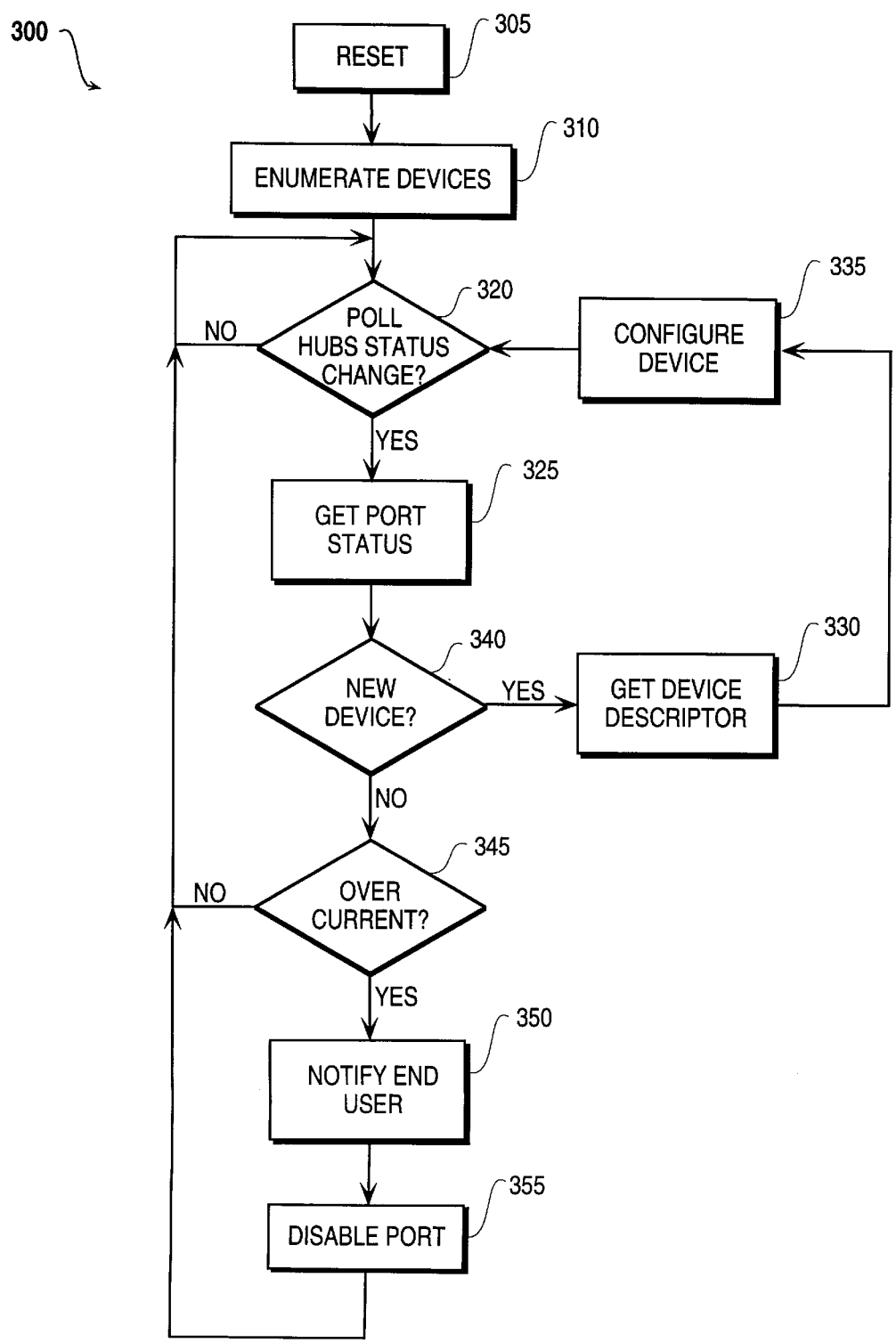
FIG. 3 shows one embodiment of a state machine diagram for detecting an overcurrent event.

FIG. 3 shows one embodiment of a state machine diagram for detecting an overcurrent event in a USB system. State diagram 300 illustrates the state transitions leading to the detection and subsequent notification of an overcurrent event in a USB system. In particular, states 305 through 355 represent the interaction between the USB software layers governing the USB system. For one embodiment, the USB software layers are included in a computer system. Thus, the USB software layers are used to facilitate the communication between the computer system and peripheral devices coupled to the computer system.

The first state in state diagram 300 is state 305. In state 305, the USB interface is reset. For one embodiment, the USB interface is reset in conjunction with the reset of the computer system using the USB system. Subsequent to the reset, state diagram 300 transitions to state 310.

In State 310, the USB system enumerates the devices coupled to the USB interface. In particular, during state 310 the USB system configures the root hub of the USB interface. During the configuration, each port of the root hub is activated and the USB system determines if a peripheral device is coupled to the root hub's ports. Provided a peripheral device is attached to the activated port, the USB system enables the port, resets the device, and assigns a unique address to the peripheral device. Subsequent to assigning the unique address, the USB system reads the device descriptor of the attached device. The device descriptor provides the USB system with information on the device's class, configuration, and interface requirements. Based on the device description, the USB system assigns a configuration value to the peripheral device. The configuration value allows the computer system to access the peripheral device.

Provided the peripheral device is a hub, however, configuration of the hub requires further steps. In particular, subsequent to reading the hub's device descriptor to ascertain the hub's power model and number of interfaces supported by the hub, the USB system determines if a peripheral device is coupled to each port of the hub. Similar to the root hub analysis, provided a peripheral device is attached to the activated port, the USB system enables the port, resets the device, and assigns a unique address to the peripheral device. Subsequent to assigning the unique address, the USB system reads the device descriptor of the attached device and assigns a configuration value to the peripheral device. This operation is performed for each port until all devices attached to the root hub are configured. Subsequent to the enumeration of peripheral devices, state diagram 300 transitions to state 320.

In state 320, the computer system periodically polls the hubs included in the USB system. Using the periodic polling, the computer system determines whether there is a change in port status. For one embodiment, the operating system polls the hubs every 255 milliseconds. The hub status report describes whether a hub has incurred a status change but does not identify the nature of the change. In particular, provided no change exists in the port status of the USB system, each hub responds to the poll request with a no acknowledge ("NAK") packet indicating no change in the port status of the hub. Accordingly, state diagram 300 remains in state 320. Provided a port status change occurs, however, the hub with the changed port responds to the poll with a data byte sequence that describes the port(s) affected by the status change. For one embodiment, the sequence comprises a bit mask with a set bit indicating the changed port. Subsequent to the changed port response, state diagram 300 transitions to state 325.

In state 325, the operating system requests port status details from the hub responding to the hub status poll. For one embodiment, each port in the responding hub provides a four byte port status information to the computer's operating system. The first two bytes of the port status information indicate a port status field. The second two bytes of the port status information indicate a port change field. The port status bytes describe the event that has occurred. The port change bytes, however, describe the current status of the port. Subsequent to receiving the port status, state diagram 300 transitions to states 340 and 345 where the port status is examined.

In state 345, the USB system determines whether the port status change results from the addition of a new device. For one embodiment, the USB system examines whether the connect status bit included in the port change field is set. In particular, provided the connect status bit is set to a value of "1", the connection to the port has changed. Accordingly, provided the current connection bit is set, the USB examines the current connect bit in the port status field to determine the connection change. For one embodiment, provided the current connect bit is set to a value of "1", a new device is attached to the hub's port. Thus, provided both the connect status bit and the current connect bit are set, the USB system determines that a new device is attached to the computer system and state diagram transitions to state 330.

In state 330, the USB system requests the device descriptor from the new device. The hub indicating the status change is used to forward the device descriptor to the operating system. Subsequent to receiving the device descriptor, state diagram 300 transitions to state 335. In state 335, the new device is configured. For one embodiment, the device configuration of state 335 follows the same steps previously described in state 310. Subsequent to the configuration of the new device state diagram returns to state 320.

Provided either the connect status bit or the current connect bit is unset state diagram 300 transitions to state 345. In state 345, the USB system determines whether the port status change is a result of an overcurrent event. In particular, the USB system examines whether the overcurrent bit included in the port status field is set. For one embodiment, provided the overcurrent bit is set to a value of "1", an overcurrent exists on the port. Provided the overcurrent bit is un-set state diagram 300 returns to state 320. Provided the overcurrent bit is set, however, state diagram 300 transitions to state 350.

In state 350, the end user is notified with information describing the hub and corresponding port causing the overcurrent event. For one embodiment, the notification occurs via a text message on a display element of the computer system. Thus, after the notification an end user can isolate the peripheral device causing the overcurrent event and remove the peripheral device from the computer system. Subsequent to the notification, state diagram transition to state 355 where the overcurrent port is disabled. For one embodiment, subsequent to an overcurrent bit indicating an overcurrent event, the overcurrent port is disabled automatically by the hub reporting the overcurrent event. For an alternative embodiment, the overcurrent port is disabled by the operating system.

Using state diagram 300 to control the transition of states within a USB system allows the detection and subsequent notification to an end user of an overcurrent event. In particular, the notification process indicates the hub and the specific port causing the overcurrent event. Accordingly, the user can resolve the overcurrent event by disconnecting the rogue device coupled to the overcurrent port and resetting the port. The end user notification is performed via a filter driver included in the USB software layers and a user interface.

Figure 4:
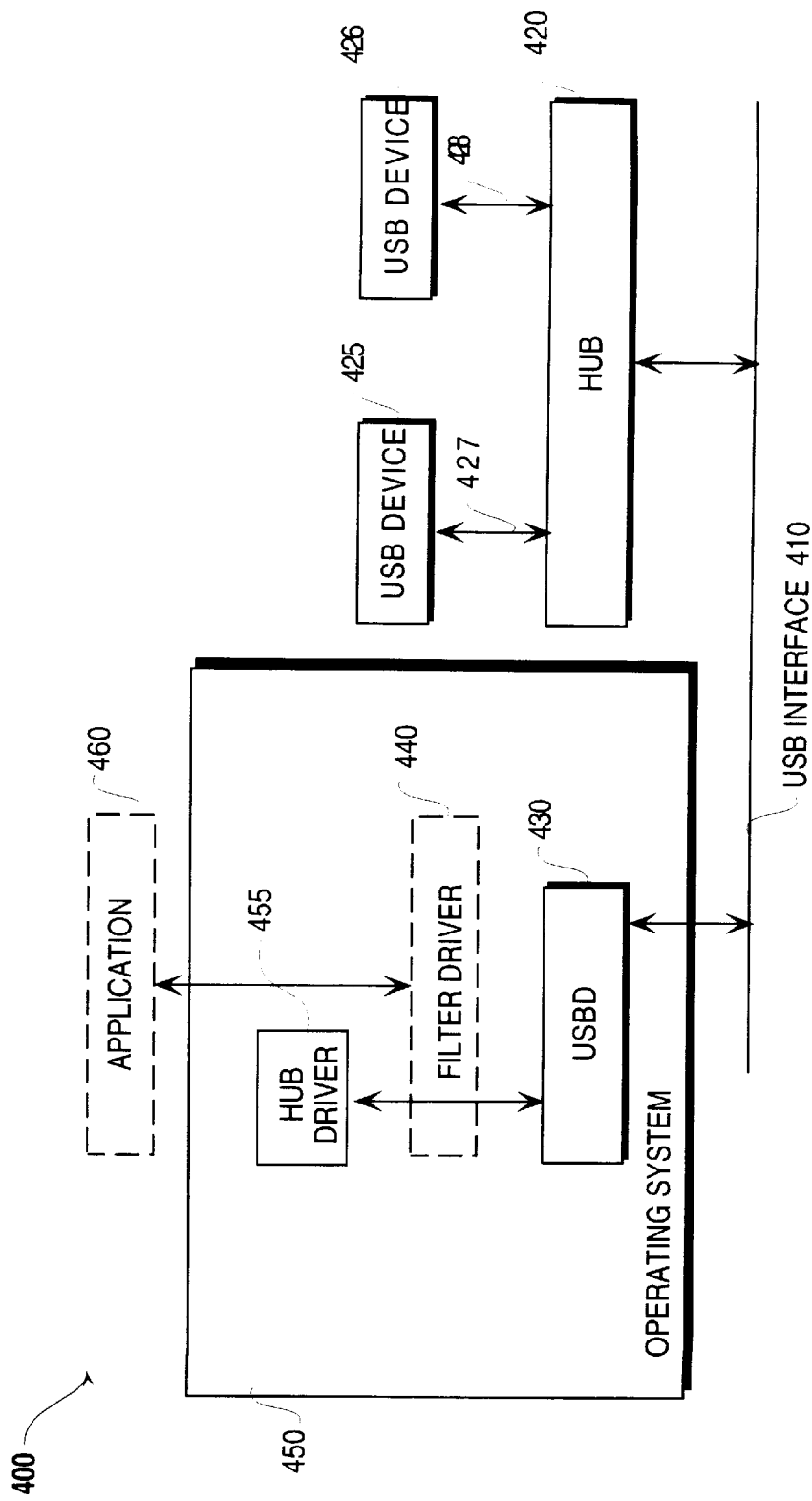
FIG. 4 shows one embodiment of a filter driver included in a USB software layer.

FIG. 4 shows one embodiment of a filter driver included in a USB software layer. In particular, USB software layers 400 illustrates operating system 450 loaded with a hub driver object code, hub driver 455. The hub driver 455 describes hub 420's functional interface. Using hub driver 455 operating system 450 provides an interface between applications and peripheral devices. In particular, hub driver 455 communicates directly with USBD 430. As previously described, USBD 430 provides the software interface for the USB serial transfer mechanism. Accordingly, USBD 430 allows the hub driver to communicate with hub 420, USB device 425, and USB device 426 via USB interface 410.

For one embodiment, operating system 450 exists in a central processing unit (not shown). Using operating system 450, the central processing unit maintains communication between applications loaded into the central processing unit and USB devices 425 and 426. In particular, operating system 430 configures hub 420, USB device 425, and USB device 426 via USBD 430. Subsequent to the hub configuration, following state diagram 300, via USBD 430 operating system 450 periodically polls hub 420 for a status change. Provided no status change, operating system 450 forwards requests from the loaded applications to USB devices 425 or USB device 426. For example, for one embodiment USB device 425 comprises a keyboard. Accordingly, a keyboard driver (not shown) is loaded in to operating system 430. The application requiring keyboard input communicates to the USB device 426 via the keyboard driver, USBD 430, USB interface 410, and hub 420.

FIG. 4 also illustrates filter driver 440 and application 460. Filter driver 440 and application 460 are used to notify an end user of an overcurrent event on a port of hub 420. In particular, filter driver 440 transparently monitors—i.e, snoops—the data flow between USBD 430 and hub driver 455. Filter driver 440 also maintains a data structure of all the hub status information supplied to operating system 450 during the polling periods. Using the data structure generated by filter driver 440, application 460 identifies an overcurrent event and notifies the end user.

For example, for one embodiment, USB device 426 is a rogue device causing an overcurrent event. Accordingly, during operating system 450's hub status poll, hub 420 responds with a data byte sequence that describes the ports affected by the status change. Subsequently, operating system 450 requests port status details from hub 420 via hub driver 455. As previously described, for each port in hub 420, port status information is returned to operating system 450 via hub driver 455. For one embodiment, filter driver 440 stores the hub status response and all the port status information in a data structure. For an alternative embodiment, filter driver 440 only stores the port status report.

Application 460 examines the data structure and determines whether an overcurrent event has occurred. For one embodiment, application 460 examines the data structure periodically. For an alternative embodiment, application 460 examines the data structure every time operation system 450 polls hub 420. In particular, application 460 creates a file with the data structure created by filter driver 440. Application 460 parses the file and checks whether the overcurrent bit is set in any of the port status inputs. For one embodiment, provided an overcurrent bit is set, application 460 stores the port status input corresponding to the set overcurrent bit, reports the overcurrent event to an end user, and flushes the data structure maintained by filter driver 440.

Following the previous example, the data structure has a set overcurrent bit because USB device 426 is a rogue device causing an overcurrent event. Accordingly, application 460 locates the set overcurrent bit during the parsing of the data structure. The overcurrent bit corresponds to a specific port status input. Thus, reading the specific port status input, application 460 determines the hub and port affected by the overcurrent event. In the present example, application 460 determines that the location of the overcurrent event occurs on port 428 of hub 420. Additionally, provided the overcurrent event occurs after the data structure has registered USB device 426 as a new device, application 460 can also determine the rogue device creating the overcurrent event. In particular, hub 420's poll status response is stored in the data structure. Thus, application 460 is able to parse through the data structure and determine the device coupled to a particular port. Accordingly, application 460 is able to determine that USB device 426 is the rogue device coupled to port 428. For one embodiment, filter driver 440 is a kernel mode driver that defines an application programmer interface ("API"). The API is used by application 460 to obtain the contents of the data structure created by filter driver 440. For an alternative embodiment, application 460 passes the hub, port, and/or rogue device information to a graphical user interface ("GUI"). The GUI presents the overcurrent information to an end user using a monitor attached to the computer system.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A method for recognizing an overcurrent event in a universal serial bus, the method comprising the steps of:
   (A) monitoring communication between a first layer and a second layer of software layers of the universal bus;
   (B) generating a data structure configured to store the communication between the first layer and the second layer; and
   (C) parsing the data structure, the parsing locating a data transition in the data structure indicating the overcurrent event.

2. The method of claim 1, wherein Step (A) further includes inserting a filter driver between the first layer and the second layer.

3. The method of claim 2, wherein the first layer comprises a hub driver.

4. The method of claim 2, wherein the second layer comprises a universal serial bus driver.

5. The method of claim 1, wherein Step (B) further includes storing hub status information communicated between the first layer and the second layer.

6. The method of claim 5, wherein Step (B) further includes storing port status information communicated between the first layer and the second layer.

7. The method of claim 1, wherein Step (C) further includes a user interface configured to examine the data structure to locate the data transition, the user interface notifying a user when the data transition is detected.

8. The method of claim 7, wherein the data transition comprises a set overcurrent bit.

9. The method of claim 7, wherein the notification comprises indicating a hub affected by the overcurrent event.

10. The method of claim 7, wherein the notification comprises indicating a port affected by the overcurrent event.

11. A computer readable medium containing executable instructions which, when executed in a processing system, cause the system to perform the steps of recognizing an overcurrent event in a universal serial bus, the steps comprising:
  (A) monitoring communication between a first layer and a second layer of software layers of the universal bus;
  (B) generating a data structure configured to store the communication between the first layer and the second layer; and
  (C) parsing the data structure, the parsing locating a data transition in the data structure indicating the overcurrent event.

12. The computer readable medium of claim 11, wherein Step (A) further includes inserting a filter driver between the first layer and the second layer.

13. The computer readable medium of claim 12, wherein the first layer comprises a hub driver.

14. The computer readable medium of claim 12, wherein the second layer comprises a universal serial bus driver.

15. The computer readable medium of claim 11, wherein Step (B) further includes storing hub status information communicated between the first layer and the second layer.

16. The computer readable medium of claim 15, wherein Step (B) further includes storing port status information communicated between the first layer and the second layer.

17. The computer readable medium of claim 11, wherein Step (C) further includes a user interface configured to examine the data structure to locate the data transition, the user interface notifying a user when the data transition is detected.

* * * * *